(12) United States Patent
Taylor et al.

(10) Patent No.: US 10,725,141 B2
(45) Date of Patent: Jul. 28, 2020

(54) ELECTROMAGNETIC SIGNAL PHASE DISCRIMINATION USING SUPERCONDUCTIVE SENSORS AND A NONLINEAR DETECTOR

(71) Applicant: The United States of America, as represented by the Secretary of the Navy, San Diego, CA (US)

(72) Inventors: Benjamin J Taylor, Escondido, CA (US); Susan Anne Elizabeth Berggren, San Diego, CA (US); Anna Leese De Escobar, Encinitas, CA (US)

(73) Assignee: United States of America as represented by Secretary of the Navy, Washington, DC (US)

( * ) Notice: Subject to any disclaimer, the term of this patent is extended or adjusted under 35 U.S.C. 154(b) by 259 days.

(21) Appl. No.: 16/050,937

(22) Filed: Jul. 31, 2018

(65) Prior Publication Data
US 2020/0041602 A1 Feb. 6, 2020

(51) Int. Cl.
*G01S 3/04* (2006.01)
*G01S 3/48* (2006.01)
(Continued)

(52) U.S. Cl.
CPC .............. *G01S 3/043* (2013.01); *G01S 3/46* (2013.01); *G01S 3/48* (2013.01); *G01R 33/0094* (2013.01);
(Continued)

(58) Field of Classification Search
CPC .............. G01R 33/035; G01R 33/0354; G01R 33/022; G01R 33/0094; G01R 19/00;
(Continued)

(56) References Cited

U.S. PATENT DOCUMENTS

| | | | |
|---|---|---|---|
| 5,936,458 A | * | 8/1999 | Rylov ...................... H03K 3/38 327/528 |
| 7,173,505 B2 | | 2/2007 | Behzad |

(Continued)

FOREIGN PATENT DOCUMENTS

JP 09230014 A * 9/1997

OTHER PUBLICATIONS

Touse, "Design, fabrication, and characterization of a microelectromechanical directional microphone," Ph.D. Dissertation Naval Postgraduate School, Monterey, California (2011).
(Continued)

*Primary Examiner* — Olumide Ajibade Akonai
(74) *Attorney, Agent, or Firm* — Naval Information Warfare Center, Pacific; Kyle Eppele

(57) ABSTRACT

First and second superconductive sensors receive an electromagnetic signal. The first and second superconductive sensors are spaced apart such that there is a phase difference between the electromagnetic signal as received at the first and second superconductive sensors. The first and second superconductive sensors output respective first and second voltage signals corresponding to the electromagnetic signal as received by the first and second superconductive sensors. A nonlinear detector detects a voltage difference between the first and second voltage signals and provides an output signal representing the detected voltage difference. The output signal corresponds to the phase difference between the electromagnetic signal as received at the first and second superconductive sensors.

20 Claims, 6 Drawing Sheets

(51) Int. Cl.
*G01S 3/46* (2006.01)
*G01R 33/00* (2006.01)
*H01Q 1/36* (2006.01)
*G01R 33/035* (2006.01)

(52) U.S. Cl.
CPC ........ *G01R 33/035* (2013.01); *G01R 33/0354* (2013.01); *H01Q 1/364* (2013.01)

(58) Field of Classification Search
CPC ..... H03F 19/00; H03K 17/92; Y10S 505/845; Y10S 505/702; Y10S 505/874; G01S 3/043; G01S 3/46; G01S 3/48; G01S 3/782; G01S 1/02; H01Q 1/364; H01Q 21/29; H01Q 3/30; H01Q 25/02; H04B 10/11; H01J 37/32082; H01J 37/32174; H01L 2924/0002; H01L 39/16; H02H 3/26
See application file for complete search history.

(56) References Cited

U.S. PATENT DOCUMENTS

| | | | |
|---|---|---|---|
| 8,208,863 B2 | 6/2012 | Behzad | |
| 8,503,693 B2 | 8/2013 | Yu et al. | |
| 9,097,751 B1* | 8/2015 | Longhini | G01R 33/0354 |
| 9,991,968 B1* | 6/2018 | Taylor | H04B 10/11 |
| 2006/0145694 A1* | 7/2006 | Oppenlander | G01R 33/0358 |
| | | | 324/248 |
| 2007/0132481 A1* | 6/2007 | Chong | H03K 19/195 |
| | | | 326/3 |
| 2007/0241747 A1* | 10/2007 | Morley | G01R 33/0354 |
| | | | 324/248 |
| 2016/0187390 A1* | 6/2016 | Kshirsagar | G01R 19/0046 |
| | | | 324/126 |

OTHER PUBLICATIONS

Kornev et al., "Bi-SQUID: a novel linearization method for dc SQUID voltage response," Supercond, Sci. and Tech., 22, 114011 (2009).

Berggren et al.,"Modeling the effects of fabrication spreads and noise on series coupled arrays of bi-squids," Superconductive Electronics Conference (ISEC), 2013 IEEE 14th International, 1-3 (2013).

Longhini et all, "Voltage response of non-uniform arrays of bi-superconductive quantum interference devices," Journal of Applied Physics, 111, 093920 May (2012).

Prokopenko et al., "DC and RF measurements of serial bi-squid arrays," IEEE Trans. on Appl. Supercond., 23, 1400607 (2013).

Kornev et al., "Active electrically small antenna based on superconducting quantum array," IEEE Trans. on Appl. Supercond., 23, 1800405 (2013).

Dalichaouch et al., "The effects of mutual inductances in two-dimensional arrays of Josephson junctions," Supercond. Sci. and Tech., 27, 065006 (2014).

Caputo et al., "Superconducting quantum interference filters as absolute magnetic field sensors," IEEE Trans. on Appl. Supercond., 15, 1044-1047 (2005).

Berggren, "Computational and mathematical modeling of coupled superconducting quantum interference devices," Ph.D. dissertation, San Diego State University and Claremont Graduate University (2012).

U.S. Appl. No. 15/604,035, filed May 24, 2017.
U.S. Appl. No. 16/037,567, filed Jul. 17, 2018.

* cited by examiner

ELECTROMAGNETIC SIGNAL PHASE DISCRIMINATION USING SUPERCONDUCTIVE SENSORS AND A NONLINEAR DETECTOR

FEDERALLY-SPONSORED RESEARCH AND DEVELOPMENT

The United States Government has ownership rights in the subject matter of the present disclosure. Licensing inquiries may be directed to the Office of Research and Technical Applications, Space and Naval Warfare Systems Center Pacific, Code 72120, San Diego, Calif., 92152; telephone: (619) 553-5118; email: ssc_pac_t2@navy.mil, referencing Navy Case 103691.

BACKGROUND

Conventional radio frequency (RF) signal detectors, such as antennas, may be used to detect a direction from which an RF signal is received. In some conventional systems, an array of distinctly spaced RF receivers are disposed to receive an RF signal. Once received, the phase difference in the received signal between the two RF receivers is measured. With the measured phase difference and the known distance between the RF receivers, the direction from which the RF signal is received may be determined.

Many radio direction finding systems operate on a large baseline to detect low frequency RF signals having very long wavelengths. Signals of such wavelengths can travel over very long distances and are useful for direction finding for applications when the line-of-sight is limited, such as direction finding systems on ships. However, detection of signals having long wavelengths requires very large antennas with large spacing therebetween. The size and spacing of antennas currently required for direction finding limits their use.

In view of the above, it would be desirable to detect the direction of electromagnetic signals without requiring large antennas operating over a large baseline.

SUMMARY

According to an illustrative embodiment, first and second superconductive sensors receive an electromagnetic signal. The first and second superconductive sensors are spaced apart such that there is a phase difference between the electromagnetic signal as received at the first and second superconductive sensors. The first and second superconductive sensors output respective first and second voltage signals corresponding to the electromagnetic signal as received by the first and second superconductive sensors. A nonlinear detector detects a voltage difference between the first and second voltage signals and provides an output signal representing the detected voltage difference. The output signal corresponds to the phase difference between the electromagnetic signal as received at the first and second superconductive sensors.

These, as well as other objects, features and benefits will now become clear from a review of the following detailed description, the illustrative embodiments, and the accompanying drawings.

BRIEF DESCRIPTION OF THE DRAWINGS

An understanding of the novel features of the subject matter of the present disclosure will be aided by the accompanying drawings, taken in conjunction with the accompanying description, in which similarly-referenced characters refer to similarly-referenced parts. The elements in the drawings may not be drawn to scale. Some elements and/or dimensions may be enlarged or minimized, as appropriate, to provide or reduce emphasis and/or further detail.

DETAILED DESCRIPTION OF VARIOUS EMBODIMENTS

References in the present disclosure to "one embodiment" or "an embodiment" means that a particular element, feature, structure, or characteristic described in connection with the embodiments is included in at least one embodiment. The appearances of the phrases such as "in one embodiment," "in some embodiments," and "in other embodiments," or similar phrases, in various places in the present disclosure are not necessarily all referring to the same embodiment or the same set of embodiments.

As used herein, the terms "comprises," "comprising," "includes," "including," "has," "having," or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or.

Additionally, use of "the," "a," or "an" are employed to describe elements and components of the embodiments herein; this is done merely for grammatical reasons and to conform to idiomatic English. This detailed description should be read to include one or at least one, and the singular also includes the plural unless it is clearly meant otherwise.

According to illustrative embodiments, phase discrimination of an electromagnetic signal as received at different superconductive sensors is accurately realized on a small platform with a small baseline with the use of a nonlinear detector including a differential circuit and a nonlinear device. The superconductive sensors output voltage signals are fed to the differential circuit. The differential circuit measures the voltage difference between the voltage signals and produces a perturbative voltage signal to drive the nonlinear device to provide an output signal. The output signal produced by the nonlinear device is a sensitive measure of the voltage difference between the voltage signals received from the superconductive sensors. In this manner, the nonlinear detector detects the voltage difference between the voltage signals and provides an output signal representing the detected voltage difference.

The output signal produced by the nonlinear detector includes an amplitude change or a frequency shift. Based on the output signal of the nonlinear detector, the phase difference can be determined even for a small voltage difference between the voltage signals output by the superconductive sensors. Using the phase difference, the direction from which the electromagnetic signal originates may be determined.

FIGS. 1A-1E illustrate systems for discriminating a phase difference between an electromagnetic signal received at first and second superconductive sensors according to illustrative embodiments.

Figure 1A:
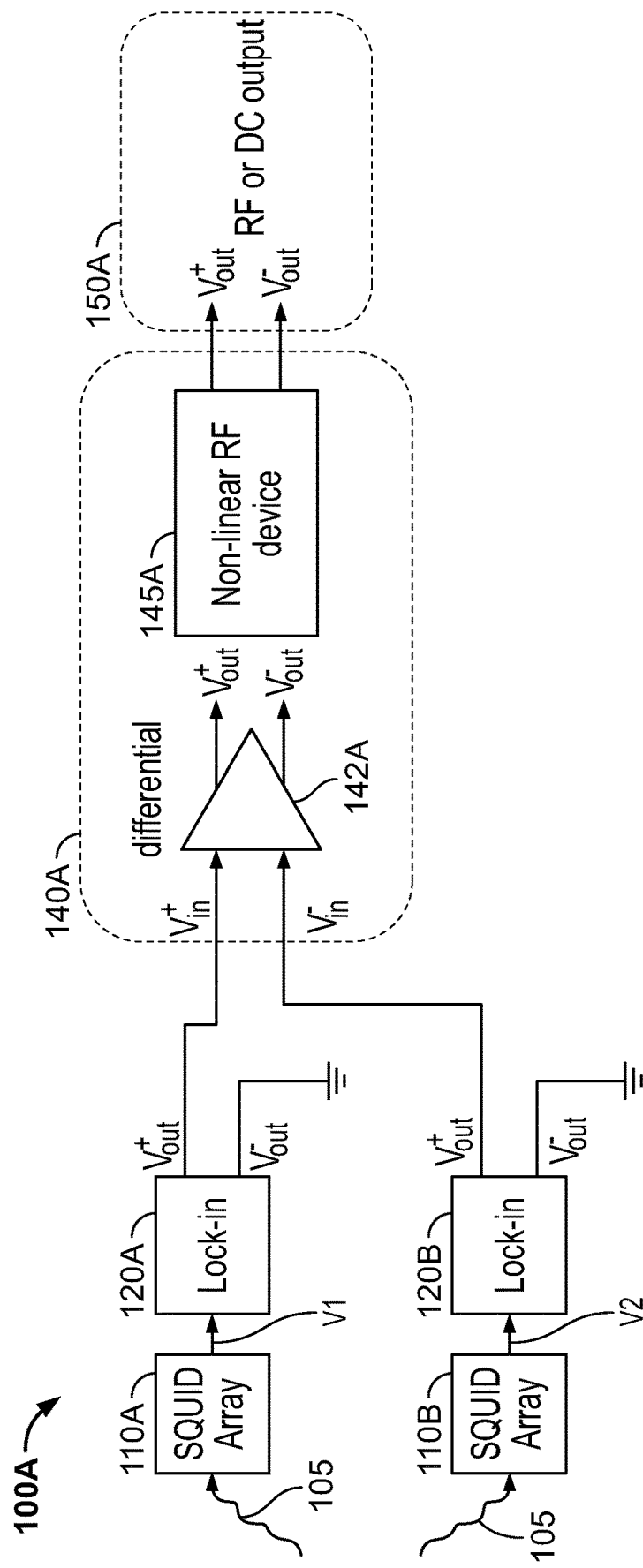
FIGS. 1A-1E illustrate systems for discriminating a phase difference in an electromagnetic signal as received at first and second superconductive sensors according to illustrative embodiments.

Referring first to FIG. 1A, the system 100A includes a first superconductive sensor 110A and a second superconductive sensor 110B. The first superconductive sensor 110A is substantially identical to the second superconductive sensor 110B. Both the first and second superconductive sensors 110A and 110B are configured to sense an electromagnetic signal 105 emanating from a source (not shown). The electromagnetic signal 105 may include a radio frequency (RF) signal.

The superconductive sensors 110A and 110B output respective voltage signals V1 and V2 that represent the electromagnetic signal 105 as received at the respective sensors. For RF signals that are received in-phase at the superconductive sensors 110A and 110B, there should be no difference in magnitude of the respective voltage signals V1 and V2. Any difference in magnitude between V1 and V2 that may occur in response to in-phase received RF signals can be adjusted through a current bias tuning of the superconductive sensors 110A and 110B during calibration of the system 100A.

The voltage signals V1 and V2 output from the first and second superconductive sensors 110A and 110B may pass through optional respective signal selective devices 120A and 120B that are configured to select and perhaps amplify a signal or frequency band of interest. For example, in the system 100A shown in FIG. 1A, the signal selective devices 120A and 120B are frequency selective lock-in amplifiers that narrow the frequency band of the electromagnetic signal received at the first and second superconductive sensors 110A and 110B to a desired frequency band, effectively limiting the frequency band of the received electromagnetic signal 105 to a narrower frequency band. It should be appreciated that instead of two lock-in amplifiers or signal selective devices, one signal selective device may be used.

As shown in FIG. 1A, the system 100A also includes a non-linear detector 140A. The nonlinear detector 140A is configured to detect a difference between the voltage signals V1 and V2 (which have optionally passed through the signal selective devices 120A and 120B, respectively) and provide an output signal 150A representing the detected voltage difference. In particular, the nonlinear detector 140A includes a differential circuit 142A and a nonlinear device 145A. The voltage signals V1 and V2 are fed into the differential circuit 142A which is configured to produce a perturbative voltage signal. The nonlinear device 145A is configured to be driven by the perturbative voltage signal to produce the output signal 150A representing the voltage difference between the voltage signals V1 and V2. The non-linear device 145A may be driven by an alternating current (AC) voltage source or a direct current (DC) voltage source (not shown).

The output signal 150A representing the voltage difference between the voltage signals V1 and V2 also corresponds to the phase difference in the electromagnetic signal 105 as received at the first and second superconductive sensors 110A and 110B. This phase difference may be used to discern a direction from which the electromagnetic signal 105 originates.

It is possible that a phase difference between the outputs of the superconductive sensors 110A and 110B can be inadvertently introduced through imperfections or differences between the signal path lengths from the superconductive sensors 110A and 110B and the differential circuit 142A. This inadvertently introduced phase difference can be characterized and calibrated for such that it does not have an impact on direction finding.

As an aid to understanding how a phase difference may be used to discern the direction from which the electromagnetic signal 105 originates, consider that the first superconductive sensor 110A and the second superconductive sensor 110B are separated by a known fixed or adjustable distance. The phase shift between the electromagnetic signal 105 as received by the first and second superconductive sensors 110A and 110B will result in voltage outputs of the sensors being shifted by the same amount. Thus, the phase difference in the incident electromagnetic signal 105 received at the first and second superconductive sensors 110A and 110B can easily be discerned from the voltage difference of the voltage outputs V1 and V2 of the sensors. Based on the distance between the first and second superconductive sensors 110A and 110B and the phase difference of the incident electromagnetic signal 105, the direction from which the electromagnetic signal 105 originates may be discerned.

Although direction finding is not discussed in further detail here, those of ordinary skill in the art will appreciate that direction finding may be performed, for example, by a digital processor using suitable algorithms based on the phase difference in the electromagnetic signal as received at the first and second superconductive sensors 110A and 110B.

In the system shown in FIG. 1A, the nonlinear detector 140A is a single differential amplifier that measures the voltage difference between the voltage signals V1 and V2 as the voltage difference between the V+ signal outputs of the signal selective amplifiers 120A and 120B, respectively. The nonlinear device 145A is a nonlinear RF device. The output signal 150A may be an RF or a DC signal. It should be appreciated that the system 100A is shown and described by way of example and that many other configurations are possible for a system for detecting a voltage difference using a superconductive sensor and a nonlinear detector.

Examples of other configurations are shown in FIGS. 1B-1E, in which like components are represented with the same reference numerals. Some components, such as the superconductive sensors 110A and 110B which are shown in FIGS. 1B-1E and also described above, are not described in detail with reference to these figures for the sake of minimizing redundancy.

Figure 1B:
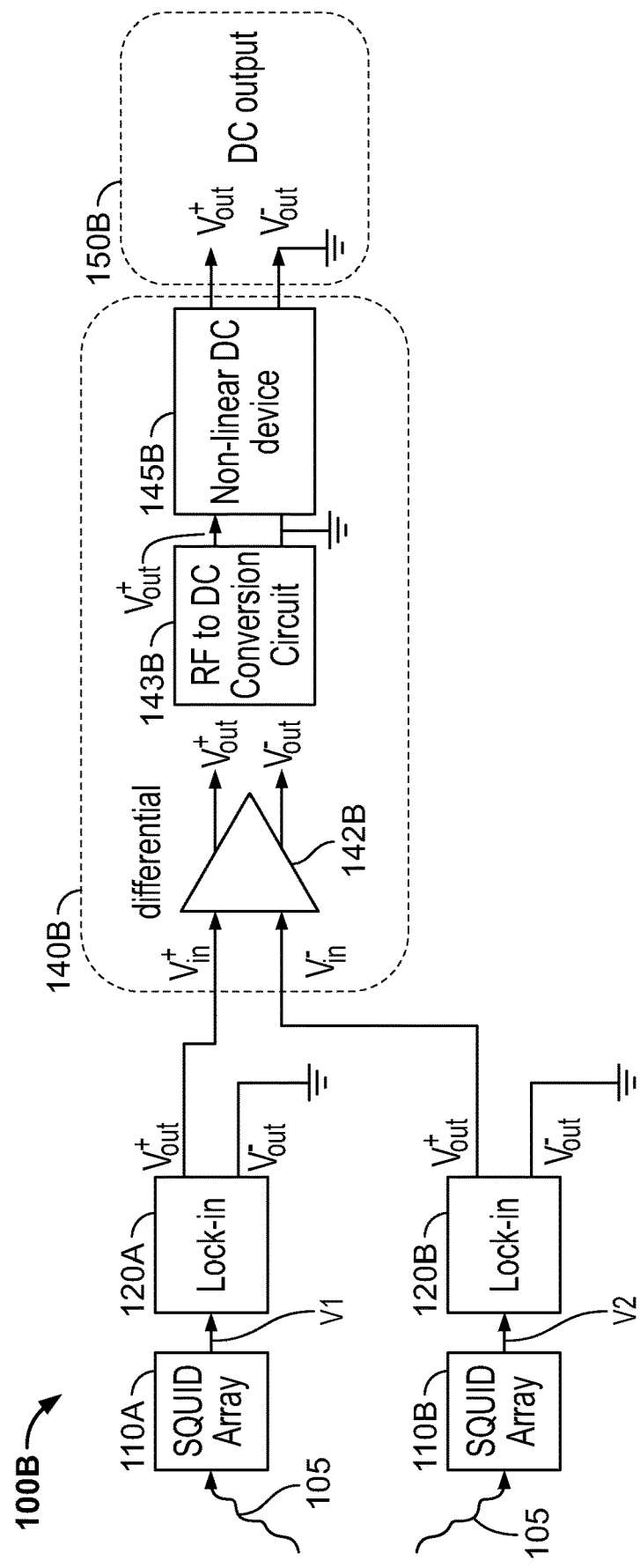

Referring to the example configuration shown in FIG. 1B, a system 100B includes a nonlinear detector 140B. The nonlinear detector 140B includes a differential circuit 142B including a single RF differential amplifier that measures the voltage difference between the V+ signal outputs of the signal selective devices 120A and 120B, in a manner similar to that shown in FIG. 1A and described above. The system 100B also includes an RF to DC conversion circuit 143B which converts the output of the differential circuit 142B into a DC voltage signal. The output of the RF to DC conversion circuit 143B is provided as a perturbative voltage signal to a nonlinear device 145B which may be implemented as a nonlinear DC device. The output signal 150B produced by the nonlinear device 145B is a DC signal that represents the voltage difference between V1 and V2.

Figure 1C:
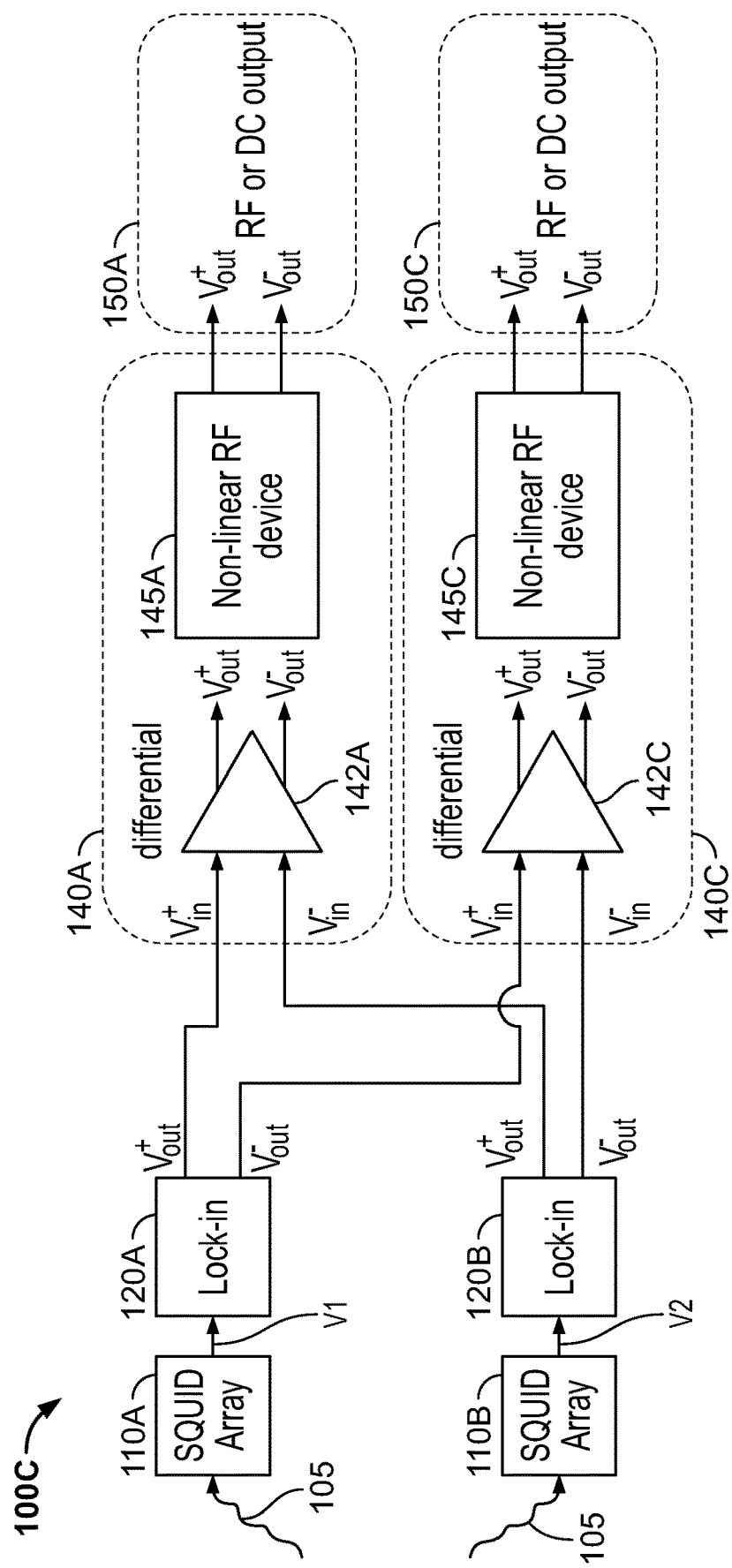

Another example configuration is shown in FIG. 1C which illustrates a system 100C including nonlinear detectors 140C and 140D. The nonlinear detectors 140C and 140D include differential circuits 142A and 142C, respectively, each of which includes a single RF differential amplifier. As in the systems 100A and 100B, the differential circuit 142A measures the voltage difference between the V+ signal outputs of the signal selective devices 120A and 120B. The differential circuit 142C measures the voltage difference between the V− signal outputs of the signal selective devices 120A and 120B. The outputs from the differential circuits 142A and 142C are provided as perturbative voltage signals to the nonlinear devices 145A and 145C, respectively. Each of the nonlinear devices 145A and 145C may be implemented as a nonlinear RF device as described above with reference to FIG. 1A. The output signals 150A and 150C produced by the respective nonlinear devices 145A and 145C may be RF or DC signals which represent the voltage difference between V1 and V2.

Figure 1D:
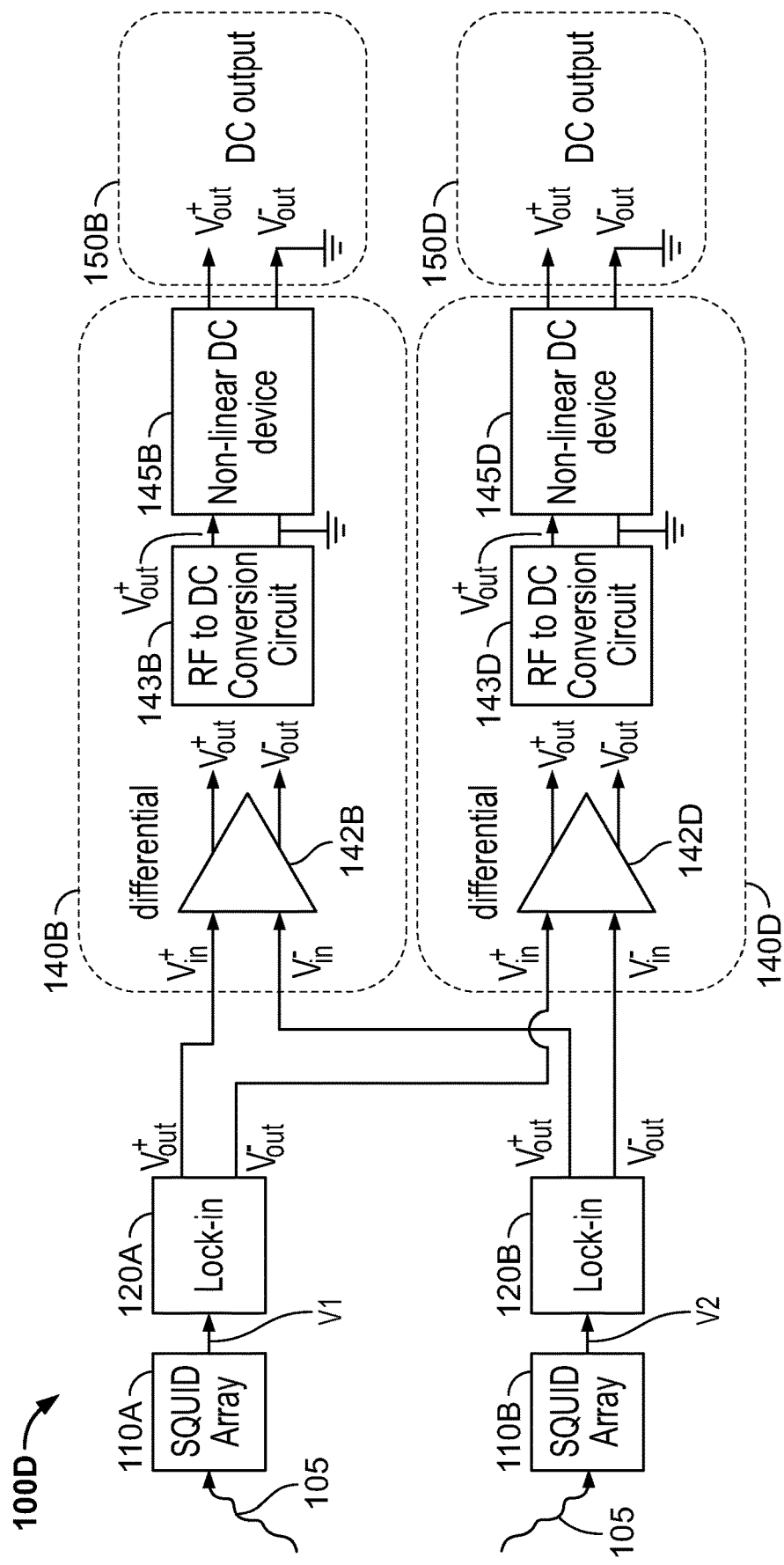

As yet another example configuration, FIG. 1D illustrates a system 100D that includes nonlinear detectors 140B and 140D. The nonlinear detector 140B, which includes a differential circuit 142B, an RF to DC conversion circuit 143B, and a nonlinear device 145B, is similar to that shown and described above with reference to FIG. 1B.

The nonlinear detector 140D includes a differential circuit 142D including a single RF differential amplifier that measures the voltage difference between the V− signal outputs of the signal selective devices 120A and 120B. The nonlinear detector 140D also includes an RF to DC conversion circuit 143D which converts the outputs of the differential circuit 142D to a DC signal and a nonlinear device 145D that receives a DC signal output from the RF to DC conversion circuit 143B as a perturbative voltage signal.

Each of the nonlinear devices 145B and 145D may be implemented as a nonlinear DC device as described above with reference to FIG. 1B. The output signals 150B and 150D produced by the respective nonlinear devices 145B and 145D are DC signals which represent the voltage difference between V1 and V2.

Figure 1E:
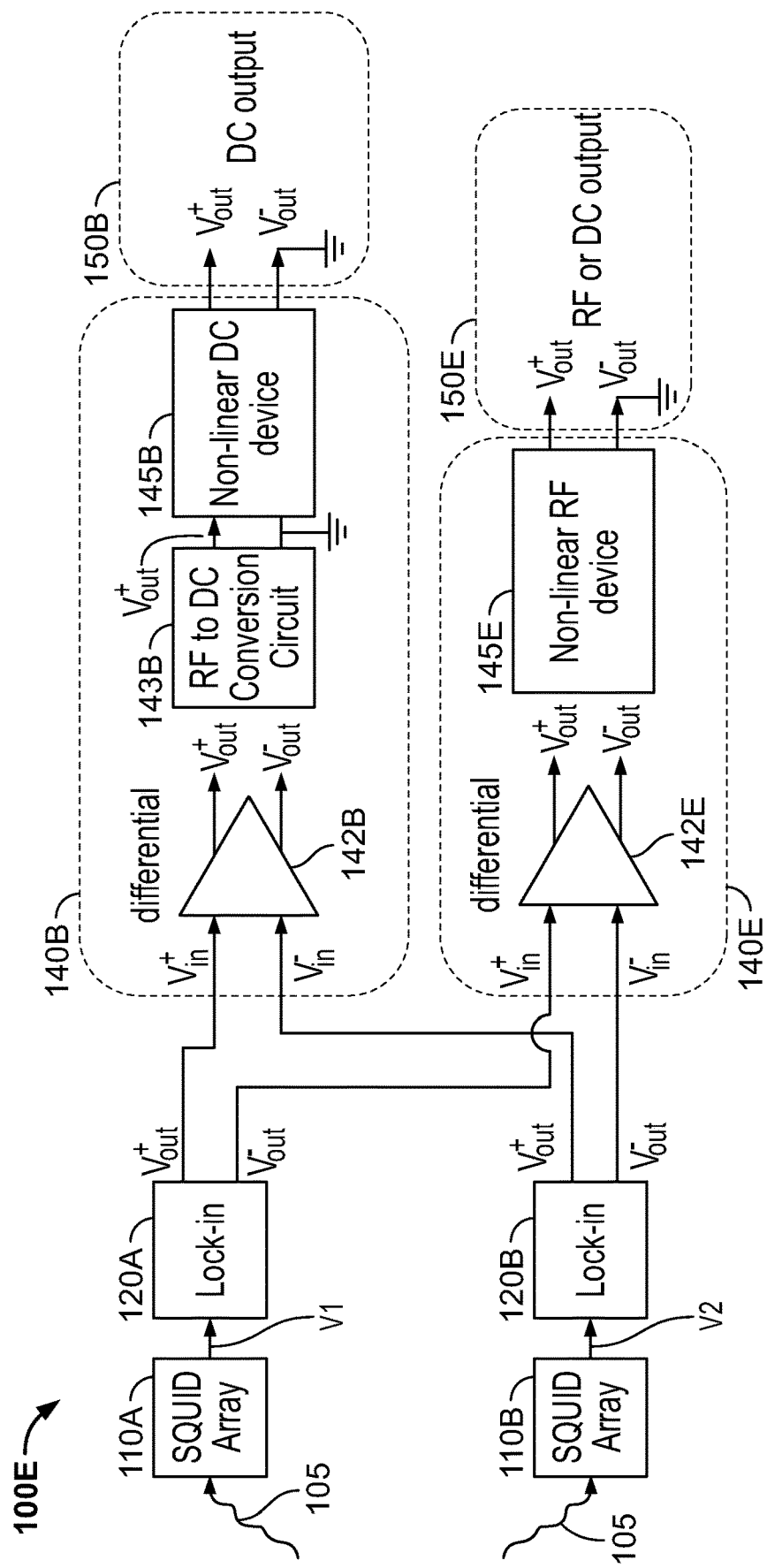

In yet another example configuration shown in FIG. 1E, a system 100E includes nonlinear detectors 140B and 140E. The nonlinear detector 140B, which includes a differential circuit 142B, an RF to DC conversion circuit 143B, and a nonlinear device 145B, is similar to that shown and described above with reference to FIGS. 1B and 1D.

The nonlinear detector 140E is similar to the nonlinear detector 140C shown in FIG. 1C and described above. The nonlinear detector 140E includes a differential circuit 142E that measures the voltage difference between the V− signal outputs of the signal selective devices 120A and 120B and provides a perturbative voltage signal to a nonlinear device 145E.

The nonlinear device 145B may be implemented with a non-linear DC device which produces the output signal 150B as a DC signal. The nonlinear device 145E may be implemented with a nonlinear RF device which produces the output signal 150E as an RF or DC signal. The output signals 150B and 150E produced by the respective nonlinear devices 145B and 145E represent the voltage difference between V1 and V2.

In the systems shown in FIGS. 1A-1E, the first and second superconductive sensors 110A and 110B are depicted as being formed of identical superconductive sensor arrays of DC Superconducting Quantum Interference Devices (SQUIDs). The SQUID arrays are N×M arrays, where N and M are non-zero integers. The SQUID arrays may be one or two dimensional with series and/or parallel coupling.

As those skilled in the art will appreciate, SQUIDs are comprised of tiny loops of superconducting material in which Josephson junctions are placed in the loop path. A Josephson junction is a region of material that provides a weak link between two fully superconducting regions. A DC SQUID has two symmetrical Josephson junctions.

SQUIDs are able to sense extremely small electromagnetic fields. A SQUID array includes many individual SQUIDs arranged in a circuit in a fashion resulting in a linear and highly sensitive magnetic field sensor. A SQUID array is capable of detecting incident electromagnetic signals at frequencies from DC well into the GHz range and outputting voltage signals representing the detected electromagnetic signals. Thus, SQUID arrays are suitable as broadband sensors in an electromagnetic signal detection system. A SQUID-based sensor is decoupled from the size of the signal's wavelength. Hence, a SQUID array can sense signals in the DC-GHz range, but still be contained fully on an approximately one by one centimeter (~1×1 cm) chip.

It should be appreciated that instead of SQUID arrays, other superconductive sensors may be used. For example, Josephson Junction arrays or bi-SQUID arrays could be used instead.

Referring again to FIGS. 1A-1E, according to illustrative embodiments, the nonlinear devices 145A, 145B, 145C, 145D, and/or 145E may include, for example, a superconductive nonlinear or tunable resonator. The superconductive nonlinear or tunable resonator may include a Josephson Junction, a Josephson Junction array, or a micro laser biased such that a small voltage difference is amplified to produce a large output signal. Other examples of nonlinear devices which may be used include but are not limited to a nonlinear microelectromechanical system (MEMS) device, a microwave nonlinear phase shifter, a nonlinear optical phase shifter, etc.

According to one embodiment, one or more of the nonlinear devices 145A, 145B, 145C, 145D and 145E includes a phase shifting device that may be implemented with, for example, a Josephson Junction biased to its critical point. In this embodiment, the output of the nonlinear device includes an amplitude change compared to an amplitude of an output that would be produced if there was no voltage difference between the voltage signals V1 and V2 output by the first and second superconductive sensors 110A and 110B, respectively. This amplitude change corresponds to a phase difference between the electromagnetic signal as received at the first and second superconductive sensors 110A and 110B. Based on the phase difference, a direction from which the incoming electromagnetic signal originates may be determined in a manner such as that described above.

According to another embodiment, one or more of the nonlinear devices 145A, 145B, 145C, 145D, and 145E includes a frequency shifting device that may be implemented with, for example, a micro laser. In this embodiment, the output of the nonlinear device includes signals that have a frequency shift that corresponds to the voltage difference between the voltage signals V1 and V2 output by the first and second superconductive sensors 110A and 110B, respectively. As frequency is related to wavelength, the frequency shift may be used, in combination with the voltage difference, to determine the phase difference of the electromagnetic signal as received at the first and second superconductive sensors 110A and 110B. Based on the phase difference, the direction from which the incoming signal electromagnetic signal originates may be discerned in a manner as described above.

Figure 2:
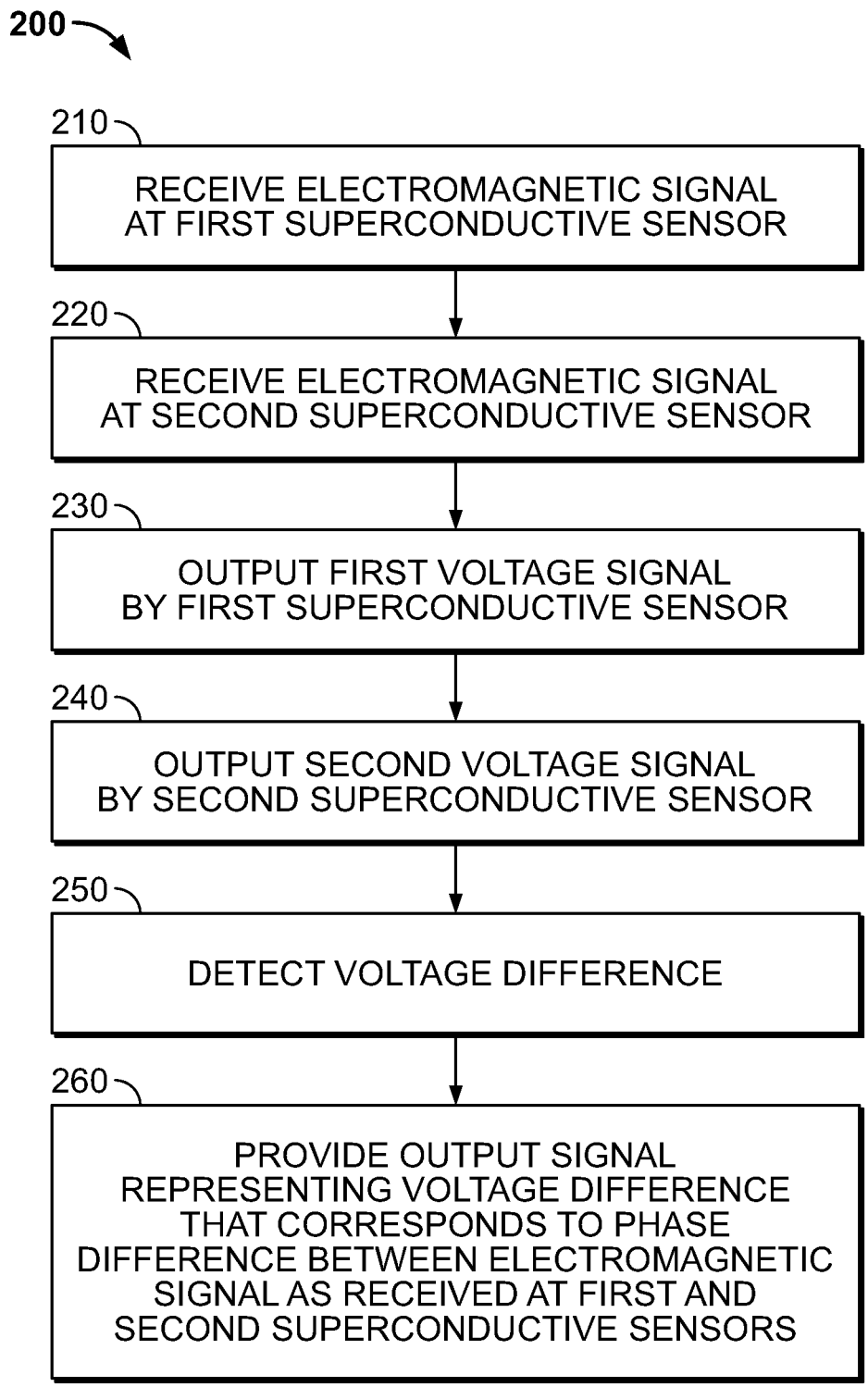
FIG. 2 is a flow chart depicting a process for discriminating a phase difference in an electromagnetic signal as received at first and second superconductive sensors according to an illustrative embodiment.

FIG. 2 is a flow chart showing steps of a process for discriminating a phase difference in an electromagnetic signal as received at first and second superconductive sensors according to an illustrative embodiment. It should be appreciated that the fewer, additional, or alternative steps may also be involved in the process and/or some steps may occur in a different order. In some embodiments the steps may be performed in a different order, or certain steps may occur simultaneously with one or more other steps.

Referring to FIG. 2, the process 200 begins at step 210 at which an electromagnetic signal is received by a first superconductive sensor. At step 220; the electromagnetic signal is received at a second superconductive sensor. At step 230, the first superconductive sensor outputs a first voltage signal corresponding to the electromagnetic signal as received by the first superconductive sensor. At step 240, the second superconductive sensor outputs a second voltage signal corresponding to the electromagnetic signal as received by the second superconductive sensor.

Next, at step 250, a nonlinear detector detects a voltage difference between the first voltage signal and the second voltage signal. As described above, this step may be performed by a differential circuit measuring a difference between the first voltage signal and the second voltage signal and outputting a perturbative voltage signal corresponding to the measured difference.

At step 260, the nonlinear detector provides an output signal representing the detected voltage difference between the first voltage signal and the second voltage signal that corresponds to the phase difference between the electromagnetic signal as received at the first superconductive sensor and the electromagnetic signal as received at the second superconductive sensor. As described above, this step may be performed by driving a nonlinear device with the perturbative voltage signal from the differential circuit to produce the output signal. As further described above, the output signal may include an amplitude change or a frequency shift. Based on this output signal, a phase difference between the electromagnetic signal as received at the first superconductive sensor and the electromagnetic signals as received at the second superconductive sensor may be determined. From the phase difference, the direction from which the electromagnetic signal originates may be determined.

According to illustrative embodiments, a direction finding system may be realized on a small platform with a small baseline. For example, for a 10 MHz signal, the baseline could be as small as twenty-one (21) cm. An even smaller baseline could be achieved with a highly resonant nonlinear detector and very sensitive superconductive sensors. The superconductive sensors and one or more nonlinear detectors could be contained on a single chip or two to three chips depending on the baseline needed. For higher frequencies, direction finding could be performed on a single chip. This design would allow for high frequency electromagnetic signal direction finding to be performed on a small platform, such as an unmanned aerial vehicle (UAV).

The use of any examples, or example-language ("e.g.," "such as," etc.), provided herein is merely intended to better illuminate and is not intended to pose a limitation on the scope of the subject matter unless otherwise claimed. No language in the present disclosure should be construed as indicating that any non-claimed element is essential.

Many modifications and variations of the subject matter of the present disclosure are possible in light of the above description. Within the scope of the appended claims, the embodiments described herein may be practiced otherwise than as specifically described. The scope of the claims is not limited to the disclosed implementations and embodiments but extends to other implementations and embodiments as may be contemplated by those having ordinary skill in the art.

What is claimed is:

1. A method, comprising:
   receiving, by a first superconductive sensor, an electromagnetic signal;
   receiving, by a second superconductive sensor, the electromagnetic signal, wherein the first and second superconductive sensors are spaced apart such that there is a phase difference between the electromagnetic signal as received at the first superconductive sensor and the electromagnetic signal as received at the second superconductive sensor;
   outputting, by the first superconductive sensor, a first voltage signal corresponding to the electromagnetic signal as received by the first superconductive sensor;
   outputting, by the second superconductive sensor, a second voltage signal corresponding to the electromagnetic signal as received by the second superconductive sensor;
   detecting, by a nonlinear detector, a voltage difference between the first voltage signal and the second voltage signal; and
   providing, by the nonlinear detector, an output signal representing the detected voltage difference between the first voltage signal and the second voltage signal that corresponds to the phase difference between the electromagnetic signal as received at the first superconductive sensor and the electromagnetic signal as received at the second superconductive sensor.

2. The method of claim 1, wherein the nonlinear detector includes a differential circuit, and wherein detecting the voltage difference between the first voltage signal and the second voltage signal comprises the differential circuit receiving the first voltage signal and the second voltage signal and producing a perturbative voltage signal corresponding to the voltage difference between the first voltage signal and the second voltage signal.

3. The method of claim 2, wherein the nonlinear detector includes a nonlinear device, and wherein providing the output signal comprises driving the nonlinear device with the perturbative voltage signal to produce the output signal representing the detected voltage difference.

4. The method of claim 1, wherein the phase difference between the electromagnetic signal as received at the first superconductive sensor and the electromagnetic signal as received at the second superconductive sensor is indicative of a direction from which the electromagnetic signal originates.

5. The method of claim 1, wherein the output signal representing the detected voltage difference includes an amplitude change.

6. The method of claim 1, wherein the output signal representing the detected voltage difference includes a frequency shift.

7. The method of claim 1, wherein the electromagnetic signal is sensed across a frequency band, and the method further comprises limiting the sensed electromagnetic signal to a narrower frequency band.

8. An apparatus, comprising:
   a first superconductive sensor configured to receive an electromagnetic signal and output a first voltage signal representing the received electromagnetic signal;
   a second superconductive sensor configured to receive the electromagnetic signal and output a second voltage signal representing the received electromagnetic signal, wherein the first superconductive sensor and the second superconductive sensor are spaced apart such that there is a phase difference between the electromagnetic signal as received at the first superconductive sensor and the electromagnetic signal as received at the second superconductive sensor, and wherein the electromagnetic signal is sensed over a frequency band;

at least one frequency selective device configured to limit the sensed electromagnetic signal to a narrower frequency band;

a nonlinear detector configured to detect a voltage difference between the first voltage signal and the second voltage signal and provide an output signal representing the detected voltage difference that corresponds to the phase difference between the electromagnetic signal as received at the first superconductive sensor and the electromagnetic signal as received at the second superconductive sensor and as narrowed by the at least one frequency selective device.

9. The apparatus of claim 8, wherein the nonlinear detector comprises:

a differential amplifier configured to receive a first signal corresponding to the first voltage signal and a second signal corresponding to the second voltage signal and output a perturbative voltage signal corresponding to the voltage difference between the first voltage signal and the second voltage signal; and a nonlinear device configured to be driven by the perturbative voltage signal to produce the output signal representing the detected voltage difference.

10. The apparatus of claim 8, wherein the phase difference between the electromagnetic signal as received at the first superconductive sensor and the electromagnetic signal as received at the second superconductive sensor is indicative of a direction from which the electromagnetic signal originates.

11. The apparatus of claim 9, wherein the output signal representing the detected voltage difference includes an amplitude change.

12. The apparatus of claim 11, wherein the nonlinear device is a phase shifting device.

13. The apparatus of claim 9, wherein the output signal representing the detected voltage difference includes a frequency shift.

14. The apparatus of claim 13, wherein the nonlinear device is a frequency shifting device.

15. The apparatus of claim 9, wherein the nonlinear device is selected from a group comprising a superconductive nonlinear resonator, a superconductive tunable resonator, a micro laser, a nonlinear microelectromechanical system (MEMS) device, a nonlinear microwave phase shifter, and a nonlinear optical phase shifter.

16. A system, comprising:

a first superconductive sensor array configured to receive an electromagnetic signal over a frequency band and output a first voltage signal representing the received electromagnetic signal;

a second superconductive sensor array configured to receive the electromagnetic signal over the frequency band and output a second voltage signal representing the received electromagnetic signal, wherein the first and second superconductive sensor arrays are spaced apart such that there is a phase difference between the electromagnetic signal as received at the first superconductive sensor array and the electromagnetic signal as received at the second superconductive sensor array;

a differential amplifier configured to receive a first signal corresponding to the first voltage signal and a second signal corresponding to the second voltage signal and output a perturbative voltage signal corresponding to a detected voltage difference between the first voltage signal and the second voltage signal; and a nonlinear device configured to be driven by the perturbative voltage signal to produce an output signal representing the detected voltage difference, wherein the detected voltage difference corresponds to the phase difference between the electromagnetic signal as received at the first superconductive sensor array and the electromagnetic signal as received at the second superconductive sensor array, wherein the phase difference is indicative of a direction from which the electromagnetic signal originates.

17. The system of claim 16, further comprising:

a first frequency selective device configured to limit the electromagnetic signal as received by the first superconductive sensor array to a desired narrower frequency band; and a second frequency selective device configured to limit the electromagnetic signal as received by the second superconducting array to the desired narrower frequency band.

18. The system of claim 16, wherein the nonlinear device includes a phase shifting device, and the output signal representing the detected voltage difference includes an amplitude change.

19. The system of claim 16, wherein the nonlinear device includes a frequency shifting device, and the output signal representing the detected voltage difference includes a frequency shift.

20. The system of claim 16, wherein the first and second superconductive sensor arrays are selected from a group comprising Superconducting Quantum Interference Device (SQUID) arrays, Josephson Junction arrays, and bi-SQUID arrays.

* * * * *